(12) United States Patent
Piper et al.

(10) Patent No.: US 7,404,160 B2
(45) Date of Patent: Jul. 22, 2008

(54) METHOD AND SYSTEM FOR HARDWARE BASED REPORTING OF ASSERTION INFORMATION FOR EMULATION AND HARDWARE ACCELERATION

(75) Inventors: Lisa J. Piper, Macungie, PA (US); Carol Lemche, Cedar, MN (US); Arthur Jurchisin, Shoreview, MN (US); Purnima Das, Cedar Park, TX (US)

(73) Assignee: Quickturn Design Systems Inc., San Jose, CA (US)

( * ) Notice: Subject to any disclaimer, the term of this patent is extended or adjusted under 35 U.S.C. 154(b) by 396 days.

(21) Appl. No.: 11/062,170

(22) Filed: Feb. 18, 2005

(65) Prior Publication Data

US 2006/0190239 A1    Aug. 24, 2006

(51) Int. Cl.
*G06F 17/50* (2006.01)
(52) U.S. Cl. ............... 716/5; 716/1; 716/4; 716/18
(58) Field of Classification Search ............. 716/18, 716/1, 5, 4; 703/27, 28, 23, 20
See application file for complete search history.

(56) References Cited

U.S. PATENT DOCUMENTS

| | | | | |
|---|---|---|---|---|
| 5,113,364 A * | 5/1992 | Ho et al. ................. 708/625 |
| 5,551,013 A * | 8/1996 | Beausoleil et al. ............ 703/23 |
| 6,035,117 A * | 3/2000 | Beausoleil et al. ............ 703/25 |
| 6,051,030 A * | 4/2000 | Beausoleil et al. ............ 703/28 |
| 6,263,302 B1 * | 7/2001 | Hellestrand et al. ........... 703/17 |
| 6,581,191 B1 * | 6/2003 | Schubert et al. ................ 716/4 |
| 6,618,839 B1 * | 9/2003 | Beardslee et al. .............. 716/4 |
| 6,718,286 B2 * | 4/2004 | Rivin et al. .................. 702/186 |
| 6,823,497 B2 * | 11/2004 | Schubert et al. ................ 716/4 |
| 7,139,988 B2 * | 11/2006 | Chard et al. .................... 716/4 |
| 2003/0074650 A1 * | 4/2003 | Akgul et al. ................. 717/129 |
| 2003/0101439 A1 * | 5/2003 | Desoli et al. ................. 717/148 |
| 2003/0226124 A1 * | 12/2003 | Marschner et al. ............. 716/4 |
| 2004/0019827 A1 * | 1/2004 | Rohfleisch et al. ............ 714/29 |
| 2005/0283664 A1 * | 12/2005 | Coulter et al. ................. 714/15 |

* cited by examiner

*Primary Examiner*—Sun J. Lin
(74) *Attorney, Agent, or Firm*—Orrick Herrington & Sutcliffe LLP (57) ABSTRACT

A method and system for hardware based reporting of assertion information for emulation and hardware acceleration is disclosed. In one embodiment, a method of performing assertion-based verification, comprises providing a user interface to design assertions that aid in verifying an integrated circuit design. Assertion instrumentation code is generated to implement the assertions in hardware as assertion instrumentation. The assertion instrumentation code is provided to an emulator that generates the assertion instrumentation.

40 Claims, 8 Drawing Sheets

METHOD AND SYSTEM FOR HARDWARE BASED REPORTING OF ASSERTION INFORMATION FOR EMULATION AND HARDWARE ACCELERATION

FIELD OF THE INVENTION

The field of the invention relates generally to hardware and software verification of logic circuits and more particularly relates to a method and system for hardware based reporting of assertion information for emulation and hardware acceleration.

BACKGROUND OF THE INVENTION

Prior to manufacture of an integrated circuit, designers verify the functionality of their designs (referred to herein as the "design under verification", or "DUV"). The DUV is usually provided in the form of a netlist description of the design. The netlist may have been derived from many sources, including from a hardware description language. A netlist description (or "netlist", as it is referred to by those of ordinary skill in the art) is a description of the circuit's components and electrical interconnections between the components. The components include all those circuit elements necessary for implementing a logic circuit, such as combinational logic (e.g., gates) and sequential logic (e.g., flip-flops and latches).

Design verification is performed because fabricating an integrated circuit is expensive and takes time. If the circuit design contains functional errors, the design will have to be corrected and then re-fabricated. Thus, many different platforms for functional verification of integrated circuits have been developed. Hardware-based design verification systems such as logic emulation systems are known devices that implement a user's design in a plurality of programmable integrated circuits. Such logic emulation systems are available from various vendors, including Cadence Design Systems, Inc., San Jose, Calif., United States of America, and others. Typical emulation systems utilize either programmable logic chips or processor chips which are programmably interconnected. In processor-based emulation systems, the DUV is processed so that its functionality appears to be created in the processors by calculating the outputs of the design. The logic itself is not implemented in a processor-based emulation system. Examples of hardware logic emulation systems using processor chips can be seen in, e.g., U.S. Pat. Nos. 5,551,013, 6,035,117 and 6,051,030. U.S. Pat. Nos. 5,551,013, 6,035,117 and 6,051,030 are incorporated herein by reference.

Another type of design verification system is known as a software simulator. Software simulators differ from hardware verification solutions in that the simulation software is executed in general purpose computers rather than in specialized hardware like an emulation system. Simulation is a software based approach, in which the DUV (or a portion thereof) and testbench are compiled into machine executable model and executed in workstation or PC. A testbench is a series of test vectors (i.e., stimulus) that are used to stimulate a design and may include modules that receive the outputs from the DUV after the vectors are run in the DUV. Since most electronic designs are presently designed using hardware description languages ("HDL") such as Verilog, a testbench is typically comprised of some HDL code.

Hardware-based verification systems and software-based verification systems each have benefits that the other lack. For example, software-based verification systems allow for very accurate verification using the exact timing (i.e., clocking) that the actual DUV will encounter when installed in a real electronic system. Software simulators allow a user to see the result of every logic operation and can graphically represent the signal transitions from high to low or from low to high on a computer monitor. While hardware-based verifications systems do not normally have this ability, hardware-based systems are orders of magnitude faster than software-based systems and therefore provide very fast verification.

In order to debug a DUV, the designer needs to look into activities of design signals over time. The reason for this is that digital circuits are driven by one or more clocks, and errors can occur at various transitions of the clocks driving the DUV. The designer faces at least two issues when evaluating design signals over time. One issue is which signal to observe (i.e., which node in the DUV to observe). A second issue is when to observe the signals (i.e., at what clock transition and/or which confluence of events—sometimes referred to as a trigger). These two issues impose serious challenges to simulation and emulation tools. First, circuit designs are typically very large (e.g., in the order of million gates). Second, the number of signals the designer would like to observe is proportionally large. Third, since the time window in which design signals need to be observed (referred to herein as the "trace window") is hard to predict prior to simulation or emulation, the designer who is debugging a design would prefer the trace window to be as large as possible.

In order to handle these issues, circuit designers have used various approaches. One such approach is to run the DUV lockstep in a simulator. With this approach, progress of simulation is controlled by the designer in interactive operation. Designers can run simulation, stop and observe signals, continue, and repeat the process. When simulation stops, designers can check the state of any signal in the design. A second approach is to perform free running simulation with signal dump. With the "free running" approach, simulation is executed freely without user intervention, and signals to be observed during simulation are dumped out during simulation. It is important to note that the signals to be dumped out must be specified before the simulation starts. These simulation approaches, while effective, are very slow. A third approach is to emulate the DUV using an emulator that allows full visibility for a fixed size of trace window. In this approach, the emulator is running freely, and signals generated by the DUV in the emulator that allow for full vision are saved for a certain period of time. A final approach is to emulate the DUV with an emulator that provides for limited visibility and replay. With this approach, limited information is saved during emulation. Designers might need to run emulation a few times in order to get sufficient information for analysis.

As discussed, one way of using a hardware-based verification system is in conjunction with a software simulator. This is sometimes referred to as simulation acceleration. Because emulators operate at speeds that can be orders of magnitude faster than simulators, emulation systems, and in particular, processor-based emulation systems, contain vast amounts of information about the state and activity in the emulated circuit. The reason for this is as follows. Simulators allow designers to view the state of a signal as it exists at a specific node in the DUV at a specific time (i.e., clock cycle) immediately after a single cycle of a simulation. A simulation cycle is the amount of time (and thus the state changes that take place) during one step of the fastest clock driving the DUV. In other words, a simulation cycle is the time of interest during a verification operation because any signal transitions that take place during simulation cycle are typically not relevant.

The only signal transitions that generally are important in a DUV are the signal transitions that exist at the end of one simulation cycle.

In simulation environments, the stimulus that drive the DUV during a simulation cycle are modeled on the workstation. In contrast, in simulation acceleration environments, the stimulus driving the DUV are sent to the emulator that is emulating the DUV, and the response is then sent back to the simulator. Because emulators run the DUVs at clock speeds that are dramatically faster than simulators, simulation acceleration can dramatically decrease the amount of time it takes to verify a DUV.

Assertions have become a popular mechanism to help designer identify the cause of errors in DUVs. An assertion is a statement of a property that can describe the assumed behavior of inputs or the expected behavior of internal signals or outputs of a design. Adding assertions to a design has many benefits, from documenting the intended behavior to aiding in the verification of the design. They can be used in a simulation or emulation environment to flag erroneous behavior, whether it is invalid stimulus or incorrect behavior of any signal in the design. Customers want to be able to develop and use the assertions in their simulation environment, and transition both the assertions and the design to the simulation acceleration and emulation environments.

Assertions throughout the design help to identify the cause of the error as soon as it occurs, close to the source. This can be especially important in emulation environments where capturing waveforms is generally limited to some predefined window of time. The size of the window impacts memory requirements and upload times. If you don't capture enough, there is a risk that the information needed for de-bugging will not be available, so capturing bugs close to their source improves the likelihood of being able to debug it without having to repeat the run. Assertions are also important to help debug failures without having to repeat a run since emulation runs can take days or even weeks to reproduce. Improving the debug capability makes the overall verification time much faster.

Two environments are considered in developing assertion reporting solutions. When the emulator can be stopped in the middle of the run, such that this environment applies to emulation environments with no targets or static targets. (Here a target is thought of as real hardware that is outside of the emulator). The second environment exists when the emulator cannot be stopped in the middle of a run. The environment that does not tolerate stopping the emulator clock applies to emulation environments that use dynamic targets. With dynamic targets, the clock to the system cannot be stopped either because:

a. the clock is generated in the target and not controlled by the emulator b. The clock is generated in the emulator, but the target needs a constant clock to maintain integrity. For example, dynamic memories that require the clock for refresh can become corrupted, thus disrupting the integrity of the system. The interrupt style approach of processing assertion failures will not work in environments that use dynamic targets.

One existing solution, uses system tasks like $display and experiences a performance degradation. There are many issues with using system tasks:

1. Not all emulators support system tasks, and those that do have limitations. In most cases string data is not supported. Environments with dynamic targets that cannot function correctly if the clock is stopped will not be able to support system tasks.

2. Performance is impacted and possibly capacity depending on the vendor implementation. The system task is executed in succession for each assertion that fires, resulting in slow performance. There is an even bigger performance and capacity impact when non-synthesizable constructs are displayed, like $time and strings.

3. The information provided for debug when an assertion fires is limited. System tasks provide data for a single point in time, which is usually insufficient for debug. Waveforms are needed because they provide historical data. Waveform upload is done from a system prompt, whereas the system task is usually in the HDL code, and the two are not linked. Thus, automatic waveform generation cannot be done with system tasks. This is not an issue in a purely simulation environment because waveforms are captured continuously, but is unsuitable in an emulation environment where waveforms must be uploaded on demand and cover some window in time, depending on the memory allocated.

4. The automatic capture of waveform information is not linked to the firing of an assertion.

Another existing solution provides assertion instrumentation with an OR gate. This solution provides a hardware status bit for each assertion and logically ORs all the status bits to produce an interrupt-like signal that indicates that an assertion fired (e.g. a failure was detected). When the interrupt-like signal is asserted, the emulator stops to report which assertions fired. A mapping file exists that associates with each assertion the fixed debug information, such as the filename, line number of the original assertion, and severity. However, the following issues exist with using an OR gate:

1. This is the slowest configuration possible because you cannot configure the number of accesses versus the bits per access to optimize for your hardware. Once an assertion firing is recognized, software will have to suspend the run (which stops the clock) and poll each assertion state signal to report which assertion(s) fired. A linear search is performed through the assertion fired bits (e.g assertion #1 is checked to see if it has fired by querying its hardware state bit, then assertion #2 is checked to see if it has fired, then assertion #3 is checked to see if it has fired . . . ) Each access requires information to be transferred from the emulator to the workstation.

2. The synthesis of the OR-gate can not be controlled, making it possible that the assertion instrumentation will be a critical path that limits runtime speeds.

3. When an assertion fires, the name of the assertion, the time or cycle number, the line of code and the filename are reported. But it is difficult to know when to capture waveforms and what signals to capture.

When dynamic targets are used, the clock to the system cannot be stopped making this solution unworkable. A major issue with transitioning assertions from simulation to emulation is the reporting capabilities that are supported across the different environments, and their effects on capacity and performance. The problem with existing approaches is that they make use of a reporting mechanism that requires extensive interaction with a workstation. This is detrimental to performance for simulation acceleration and emulation environments, and can result in the loss of information when dynamic targets are used.

SUMMARY

A method and system for hardware based reporting of assertion information for emulation and hardware acceleration is disclosed. In one embodiment, a method of performing assertion-based verification, comprises providing a user interface to design assertions that aid in verifying an integrated circuit design. Assertion instrumentation code is generated to implement the assertions in hardware as assertion instrumentation. The assertion instrumentation code is provided to an emulator that generates the assertion instrumentation.

The above and other preferred features of the invention, including various novel details of implementation and combination of elements, will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

DETAILED DESCRIPTION

A method and system for hardware based reporting of assertion information for emulation and hardware acceleration is disclosed. In one embodiment, a method of performing assertion-based verification, comprises providing a user interface to design assertions that aid in verifying an integrated circuit design. Assertion instrumenthtion code is generated to implement the assertions in hardware as assertion instrumentation. The assertion instrumentation code is provided to an emulator that generates the assertion instrumentation.

In the following description, for purposes of explanation, specific nomenclature is set forth to provide a thorough understanding of the present invention. However, it will be apparent to one skilled in the art that these specific details are not required in order to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Figure 1:
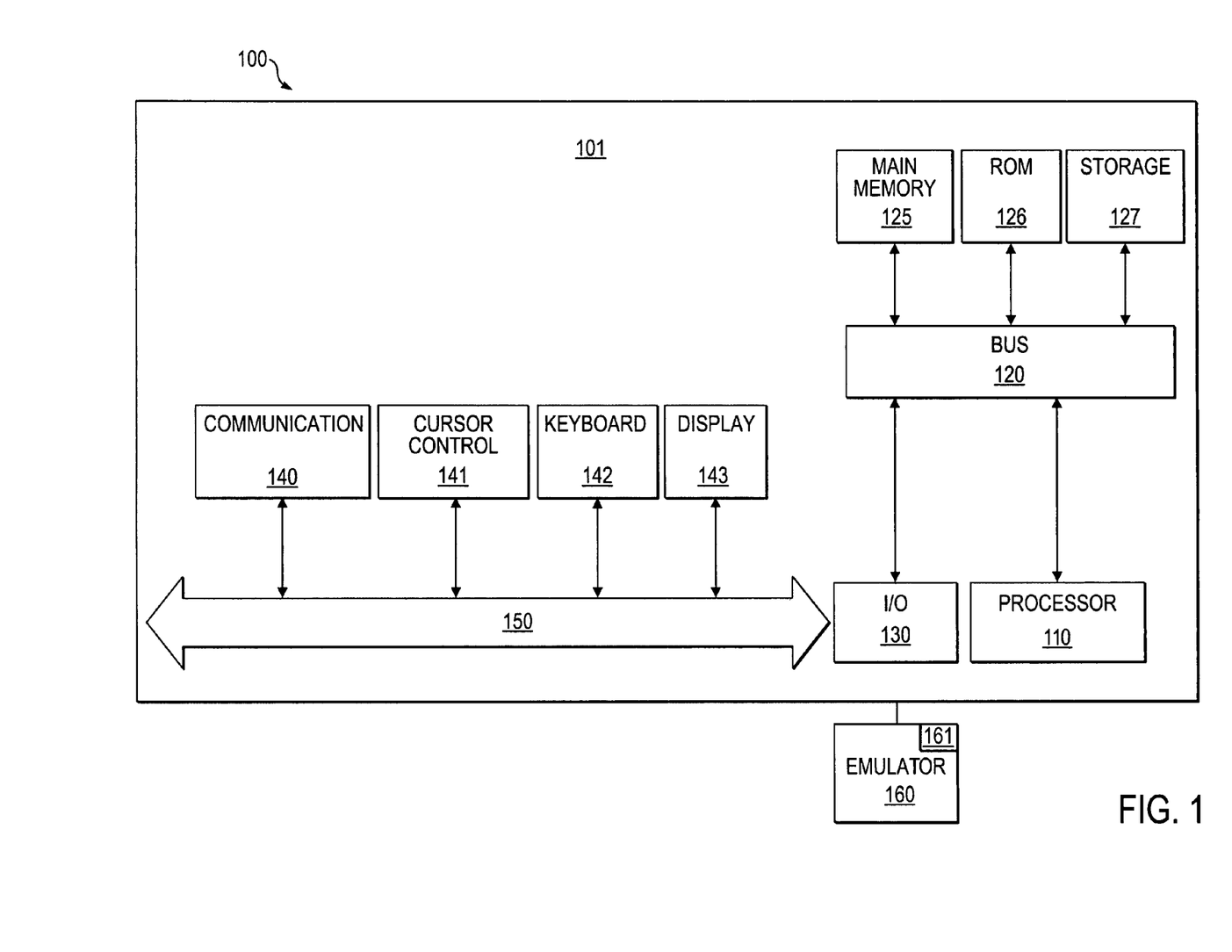
FIG. 1 illustrates a block diagram of an exemplary high-speed verification system, according to one embodiment of the present invention.

Turning to the figures, the presently preferred apparatus and methods of the present teachings will now be described. FIG. 1 illustrates a block diagram of an exemplary high-speed verification system, according to one embodiment of the present invention. More specifically, verification system allows for integrated circuit (IC) verification using simulation assertions. A workstation 10 has a central processing unit ("CPU") 110 which can execute computer instructions, including instructions forming a software simulation program.

One embodiment of workstation 10 comprises a system bus 120 for communicating information, and a processor 110 coupled to bus 120 for processing information. Workstation 10 further comprises a random access memory (RAM) or other dynamic storage device 125 (referred to herein as main memory), coupled to bus 120 for storing information and instructions to be executed by processor 110. Main memory 125 also may be used for storing temporary variables or other intermediate information during execution of instructions by processor 110. Workstation 10 also may include a read only memory (ROM) and/or other static storage device 126 coupled to bus 120 for storing static information and instructions used by processor 110.

A data storage device 127 such as a magnetic disk or optical disc and its corresponding drive may also be coupled to computer system 100 for storing information and instructions. Computer system 100 can also be coupled to a second I/O bus 150 via an I/O interface 130. A plurality of I/O devices may be coupled to I/O bus 150, including a display device 143, an input device (e.g., an alphanumeric input device 142 and/or a cursor control device 141). For example, web pages and business related information may be presented to the user on the display device 143.

The communication device 140 is for accessing other computers (servers or clients) via a network. The communication device 140 may comprise a modem, a network interface card, or other well known interface device, such as those used for coupling to Ethernet, token ring, or other types of networks.

The workstation can be any type of computing device including a personal computer, etc. The workstation 10 may be a SUN Ultra 60, Ultra 80, Ultra 450, Blade 1000, HPJ6000, IBM RS/6000 F80, Dell Workstation 530, IBM Intellistation ZPro 6866, or similar computing device.

Emulation system 160 works with workstation 10 to provide simulation acceleration of DUVs. For assertions that are in the emulator 160, efficient hardware based error reporting circuitry, called the assertion instrumentation 161 is used. Assertion instrumentation 161 is included in emulation system 160. The assertion instrumentation 161, which when coupled with workstation 10 allows for hardware-based reporting of assertion information during verification of DUVs. Emulation system 160 may be a Palladium Accelerator/Emulator manufactured by Cadence Design Systems of San Jose, Calif.

The present method and system define the assertion instrumentation 161 and related runtime processes executed on workstation 10 for supporting assertions in hardware. Different types of assertion instrumentation 161 are used for different environments, use models within each environment, design characteristics, and the stage of verification of the design. The runtime process is heavily tied to the assertion instrumentation 161.

The present method and system present hardware instrumentation for various environments that range from environments that allow unlimited starting and stopping of a run to environments that cannot be stopped. Whether the run can be started or stopped may be determined by clocking requirements, performance requirements, or other factors.

The assertions may be categorized as follows:
1. individual assertions,
2. all assertions in a module or entity,
3. all assertions in an instance,
4. all assertions in the design,
5. by type or level (e.g. structural, interface, architectural or functional . . . )
6. by severity
7. any combination of the above Environments that Allow Starting and Stopping There are at least two advantages to being able to stop an emulation run:
1. A use model in this environment is similar to the use model of a traditional simulation environment. Specifically, all assertions failures can be reported. Information typically includes the assertion name, source file location and line number, severity, time/cycle number of the failure, and sometimes the assertion code itself. In addition, waveforms that show what led to the assertion failure can be provided.
2. The hardware capacity overhead can be minimized because history need not be maintained in hardware.

However, there is a significant performance slowdown in emulator 160 every time the clock is stopped. For this reason, the user might choose to implement a combination of techniques, depending on the use model, the design, the stage of verification, or performance requirements.

Assertion instrumentation 161 is constructed from a user configurable vectored OR-tree. Additionally, assertion state information is grouped into vectors in a hierarchical tree structure that can be more efficiently searched to determine the cause of an assertion firing. The output of the assertion instrumentation 161 (vectored OR-tree) is an interrupt-like signal that is asserted when an assertion fires.

The depth or width of the OR-tree can be configured for specific environments. The width of the OR-tree impacts how many transfers between the workstation 10 and the emulator 160 used to determine which assertion failed, while the depth of the OR-tree impacts the maximum verification speed that is achieved. The number of transfers required to determine the firing signal is reduced by logn. The vector size is configured to optimize hardware characteristics.

Figure 2:
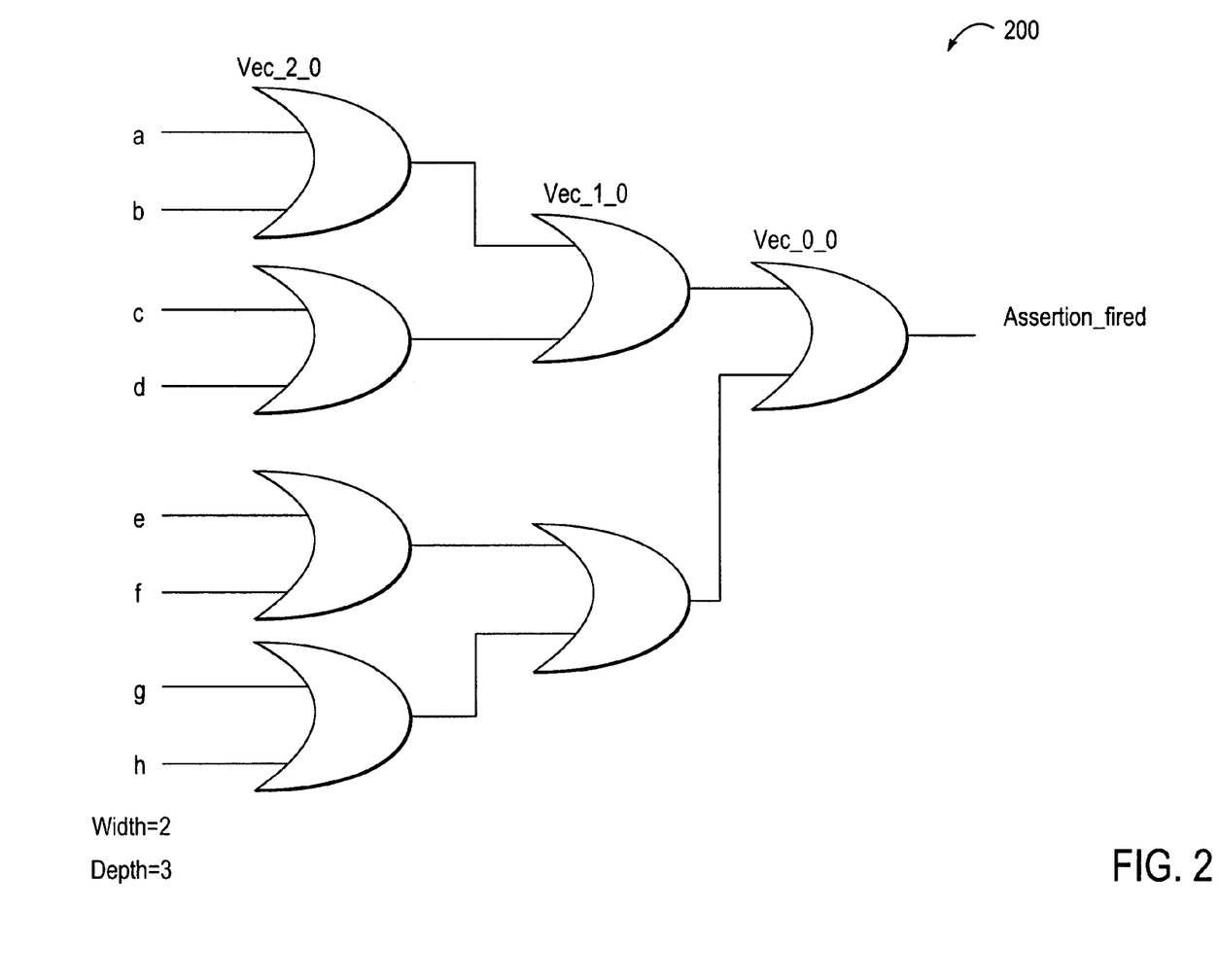
FIG. 2 illustrates an exemplary vectored OR-tree, according to one embodiment of the present invention.

FIG. 2 illustrates an exemplary vectored OR-tree 200, according to one embodiment of the present invention. The embodiment shown in FIG. 2 has 8 assertions, where the width=2 and depth=3. If "a" fires, the value of Vec__0__0, Vec__1__0, and Vec__2__0 would need to be transferred to the workstation, halving the number of transfers required if a vectored OR-tree were not used. As the vector size is increased, the number of transfers is reduced, though the hardware will influence how much can be done in one transfer. According to one embodiment, 32 bit vectors are used. The hardware generates a signal indicating an assertion fired.

Vectored OR-trees may be configured, created, edited, and observed by a user via an assertion engine running on workstation 10. One example of an environment that can support assertion development is the Incisive simulator manufactured by Cadence Design Systems of San Jose, Calif. The assertion engine tracks and summarizes assertion activity. When assertions are being developed, waveforms may be generated and displayed on a browser that allows identification of the point of an assertion failure and can be linked to a source code definition of that assertion. The browser can also show the current values of signals that contribute to the assertion result. In addition, the name of the failing assertion, the line number and filename of the instantiation of that instance, and the time of failure is reported on the browser and in a log file.

A user can create assertion instrumentation through the assertion engine and test that the assertions express the intended property. When the user is ready to move the assertion design to the emulator 160, the assertion engine is used to create hardware based assertion instrumentation. A script is provided from the engine that creates an assertion instrumentation module, related runtime compilation directive files, and related runtime analysis procedures. The assertion instrumentation logic does not change unless new assertions are added to the DUV or the hierarchy of the design is changed. The assertion instrumentation module is provided to the emulator 160 and integrated into the emulation.

Figure 3:
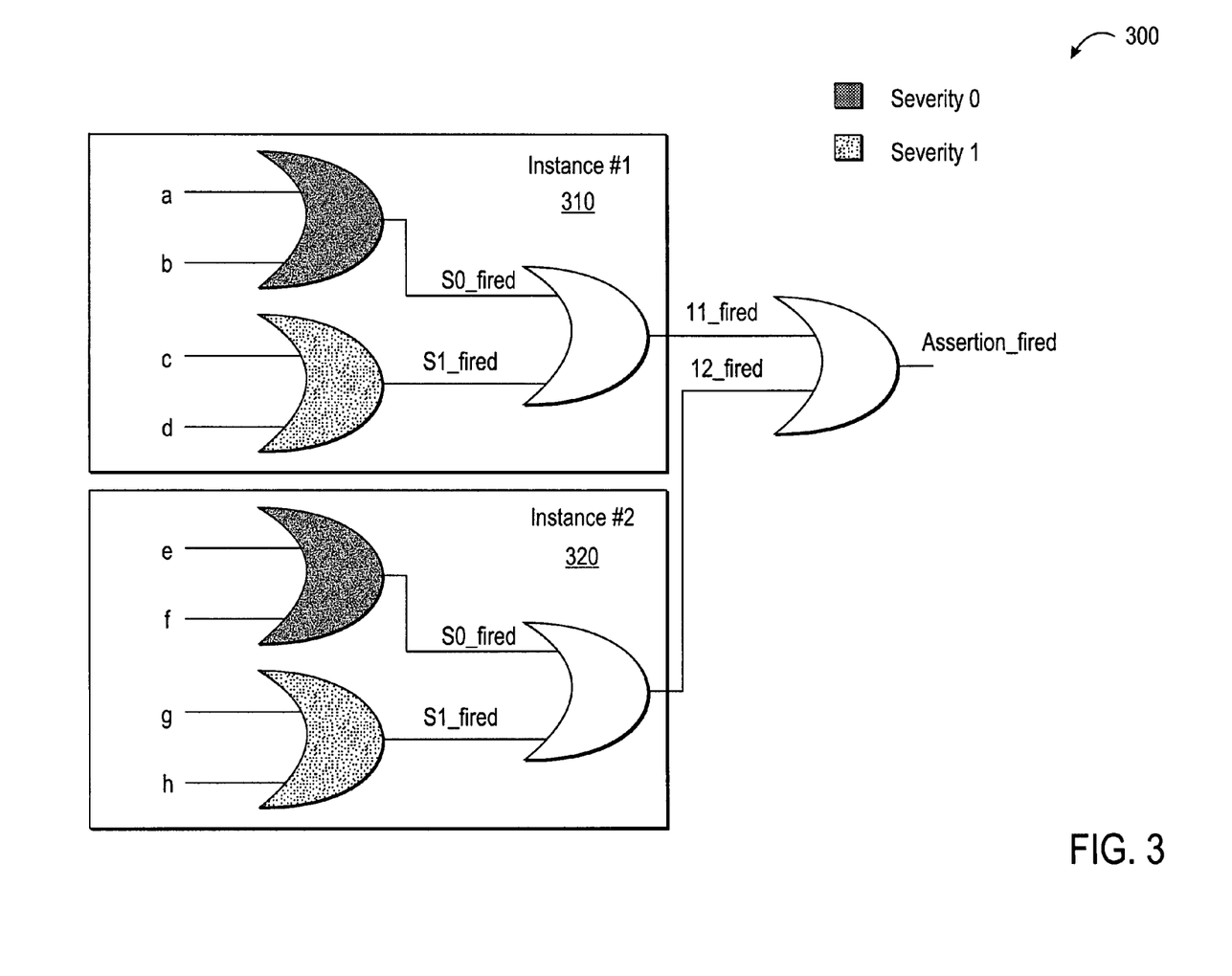
FIG. 3 illustrates an exemplary vectored OR-tree that is organized into hierarchical blocks, according to one embodiment of the present invention.

There are many ways to configure the vectored OR-tree and configure the way that assertions are presented in the vectored OR-tree. For example the vectored OR-tree may be configured, by:

a. the severity of the assertion that will be included in the vectored OR-tree. For example, the user may not want assertions with a severity of type "info" or "warning" to be reported because any reporting will impact performance. Severity can also be represented by a number versus a level. FIG. 3 illustrates an exemplary vectored OR-tree 300 that is organized into hierarchical blocks, according to one embodiment of the present invention. Severity is represented by two values in vectored OR-tree 300, either as Severity 0, or Severity 1. Vectored-OR-tree also illustrates 8 assertion state signals (a-h).

b. the type of assertion directives that will impact the vectored OR-tree. Assertions that are written for coverage should not affect the content of the OR-tree. This is generally distinguished with an assertion related verification directive, such as cover in PSL. There may also be different types such as structural, interface, or architectural level assertions.

c. the category of the assertion. The user can limit or turn off assertion firings by category. This is performed via extensive software control and filtering, and by constructing the assertion instrumentation by hierarchical block. Vectored-OR tree 300 includes two hierarchical blocks, instance #1 310 and instance #2 320.

d. using the first-fired approach to limit the number of stops per instance (block) or per assertion.

The configurable vectored OR-tree, allows for:

a. control of timing aspects that affect the speed at which the circuit can run.

b. the reduction of the number of queries required to determine which assertions failed. The assertions can be configured for hardware optimization. For example, in the vectored OR-tree 300, when one assertion fires, a maximum of three vectors are queried to determine which assertions failed, versus having to query each of the 8 assertion state signals (a-h).

c. efficiently handling the enabling and disabling of all assertion firings at an instance level or module level at runtime. Alternately, if the structure of the OR-tree is based on severity, control of enabling and disabling of all assertion firings based on severity is more efficient. In alternate embodiments, combinations are possible.

Run time control is used to limit potential performance degradations. Limits are placed on the total number of assertion failures seen before the run is terminated or the number of cycle times in which at least one failure is seen before the run is terminated. Limits are placed on the number of cycles in which at least one assertion fails is the number of times the emulator 160 has stopped. The number of failures are tracked in hardware or in software depending on the desired performance. Having limits to prevent an excessive number of assertion failures that often means that the integrity of the simulation is lost, and little is to be gained by continuing the run. The law of diminishing returns also applies in that each assertion failure may have the same error or root cause.

In one embodiment, distinct limits are based on the severity of the failing assertion. For example, whether the assertion firing is the first time (or some specified number of times) for this assertion to fail. Another example is whether the assertion firing is the first time (or some specified number of times) for an assertion in this hierarchy to fail. Yet another example is whether the assertion firing is the first time (or some specified number of times) for an assertion in this module/entity type to fail.

In another embodiment, limits are based on the number of times waveforms are provided. Providing waveforms to the simulator running on workstation 10, results in the biggest performance hit. Consequently, during the design of assertions, the waveforms will only be rendered under specified conditions. Such conditions include the severity of the reported assertion firing(s), whether or not a maximum number of uploads has been exceeded, whether this is the first time (or some specified number of times) for this assertion to fail, whether this is the first time (or some specified number of times) for an assertion in this hierarchy to fail, whether this is the first time (or some specified number of times) for an assertion in this module/entity type to fail.

The amount of information that is provided in the waveform affects the time required to do the upload as well as memory capacity. So in yet another embodiment, a limit to the information provided in the waveform is created. This can be limited by controlling the time span of interest, and the number of signals. The number of signals can be controlled by specifying whether to provide all signals of the instance or just signals in the cone of influence and the hierarchy depth.

The relative location of the assertion failure within the waveform view enables the debugging of multiple assertions in one waveform capture. It is often true that when one assertion fires, there is a ripple effect that results in other assertion firings. By off-setting the point in time when the firing occurs relative to the end of the viewing period, one can increase the probability of seeing additional failures in one upload. Any combination of the limits above can result in terminating the reporting of failures or terminating the run completely.

Figure 4:
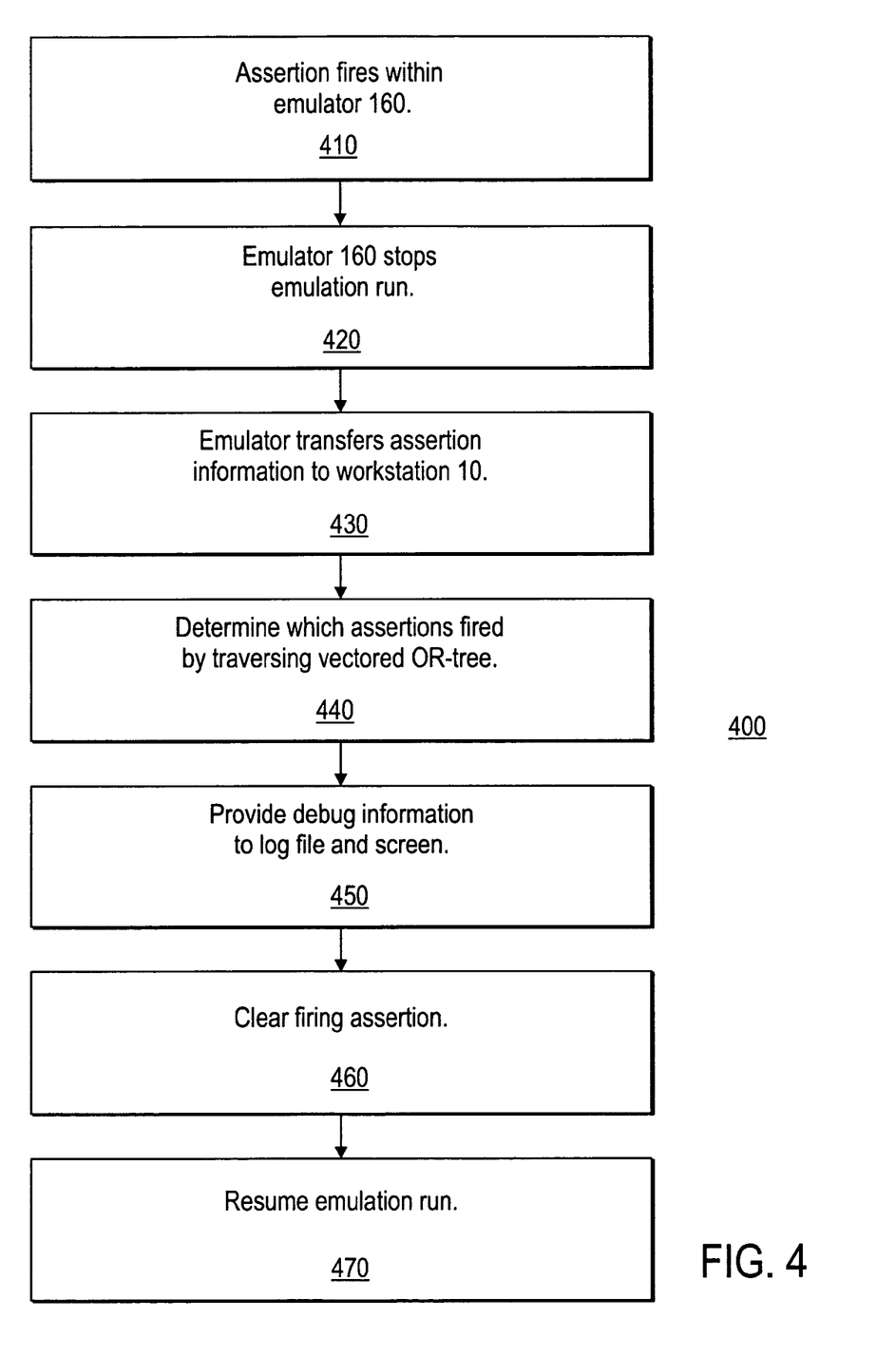
FIG. 4 illustrates a flow diagram of an exemplary process for the hardware reporting of assertion information when emulation runs can be stopped and restarted, according to one embodiment of the present invention.

FIG. 4 illustrates a flow diagram of an exemplary process for the hardware reporting of assertion information when emulation runs can be stopped and restarted, according to one embodiment of the present invention. The runtime process 400 runs until an assertion fires. (block 410) The firing of any assertion causes the emulator to stop (e.g., the assertion_fired indicator is connected to an interrupt-like trigger). (block 420) This may involve the stopping of the clock. Emulator 160 transfers assertion information to workstation 10. (block 430) The assertion information includes a mapping file that assertion state information. An assertion processing script determines which assertions fired by traversing the vectored OR-tree. (block 440) For each fired assertion, the mapping file provides the debug information that is printed to the log file and/or screen. (block 450) Each firing assertion is then cleared by depositing a logic "0" on the state register of assertion, according to one embodiment. (block 460) The deposit keeps the signal from re-firing when the run is resumed without blocking the update of the state when the next clock for that assertion occurs. This enables supporting assertions that are driven with different clocks. Emulator 160 resumes its run of the DUV. (block 470)

Environments that do not Stop the Run

Environments that do not tolerate (the clock) being stopped (as described above), store information in hardware and post-process it. It may not be practical to provide an exhaustive report that details all the assertion firings and relevant times, considering the system 100 is run for days or even weeks at a time. Thus, assertion information is selectively stored in the emulator/accelerator 160. The amount of information collected can be varied.

According to one embodiment, the user manages what information is stored, when it gets stored, and how it is processed. The primary use models supported include at least:

1. the hardware design engineer. The hardware engineer most typically will attempt to debug assertion firings by resolving the first assertion to fire, then looking at subsequent firings that might not be related to the first. This is because often the downstream assertion firings are a result of the first error. Often, the issue is resolved and the emulator is re-run to see if there are any other issues. The challenge the hardware designer has is figuring out what other assertions fired that were not related to the first.

2. the software developer. A software developer can benefit from hardware assertions by using them to distinguish whether operation errors are due to the software code or due to some hardware issue. The software developer will typically run the emulator to reach some initialization point and then start testing his/her code. The only interest is whether any assertions fire during the running of his/her code, indicating a potential hardware issue. A pass/fail indication is sufficient, though additional information is perhaps beneficial to the hardware design engineer that gets to fix the problem.

3. regression runs. Regressions runs often contain a fixed stimulus that can be easily reproduced. In addition, there exist expected results so that known issues can be masked. Here the user often just wants a pass/fail indication at the end. It is not considered to be an issue to re-run either in a simulator or in the emulator for debug. For regression runs, as a minimum, it is desirable to be able to enable or disable individual assertions, all assertions in a module or entity, or all assertions in an instance, and also provide a pass/fail indication.

For these use models, the invention includes the ability to categorize the assertions by: individual assertions, all assertions in a module or entity, all assertions in an instance, or all assertions in the design, by type or level (e.g. structural, interface, architectural or functional . . . ) by severity, or any combination of the above. Runtime control allows for enabling/disabling capturing assertion information at any time.

Figure 5:
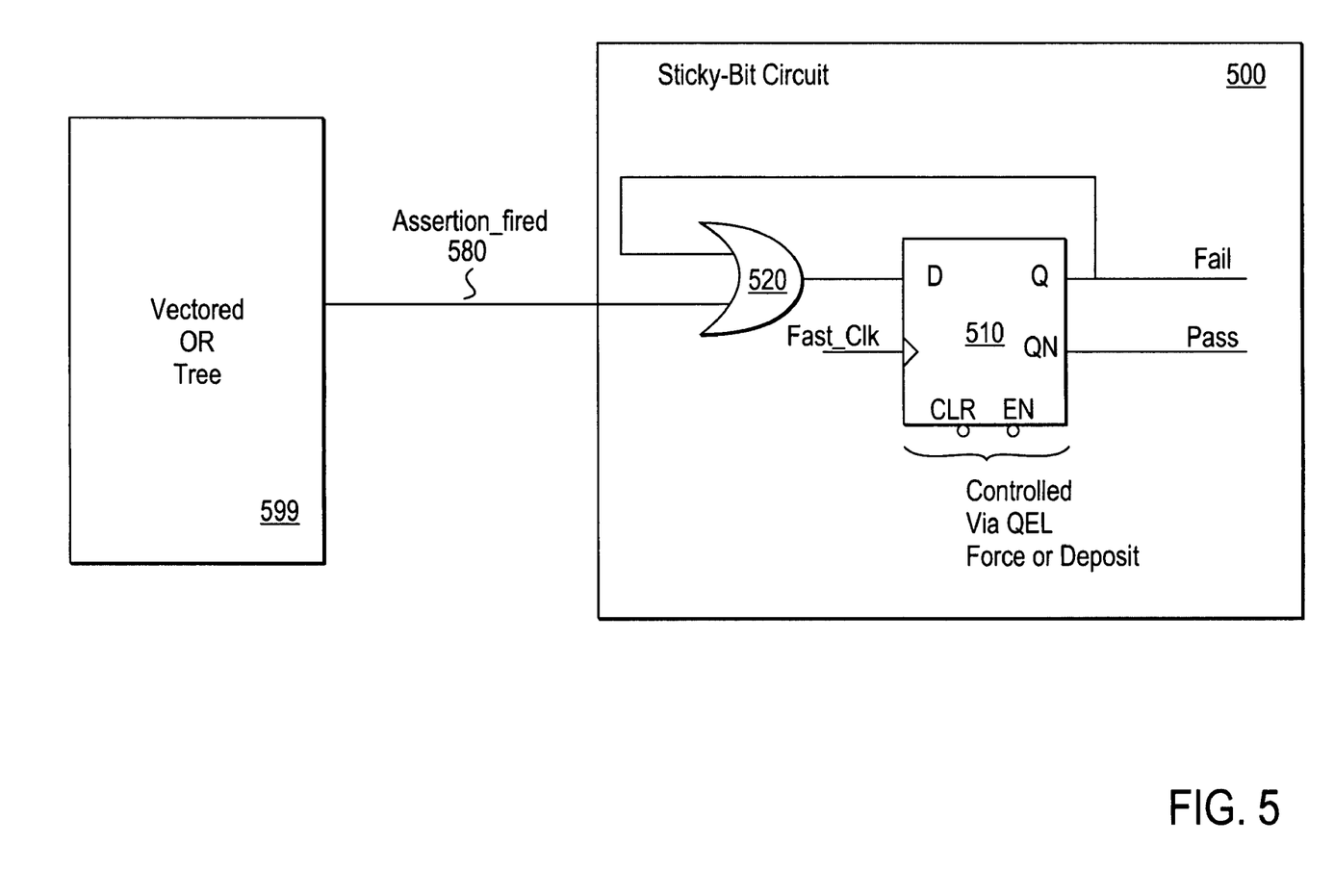
FIG. 5 illustrates a block diagram of an exemplary sticky-bit circuit, according to one embodiment of the present invention.

FIG. 5 illustrates a block diagram of an exemplary sticky-bit circuit, according to one embodiment of the present invention. A vectored OR-tree 599 is provides an assertion signal 580 to the sticky-bit circuit 500. For pass/fail applications, one sticky-bit register 510 is set and remains set when any subsequent assertion fires, as indicated by the output of the vectored OR-tree 599 as described above. This embodiment provides for minimal overhead and the least amount of debug information. Thus, it is sufficient for the software designer and for regression tests.

Figure 6:
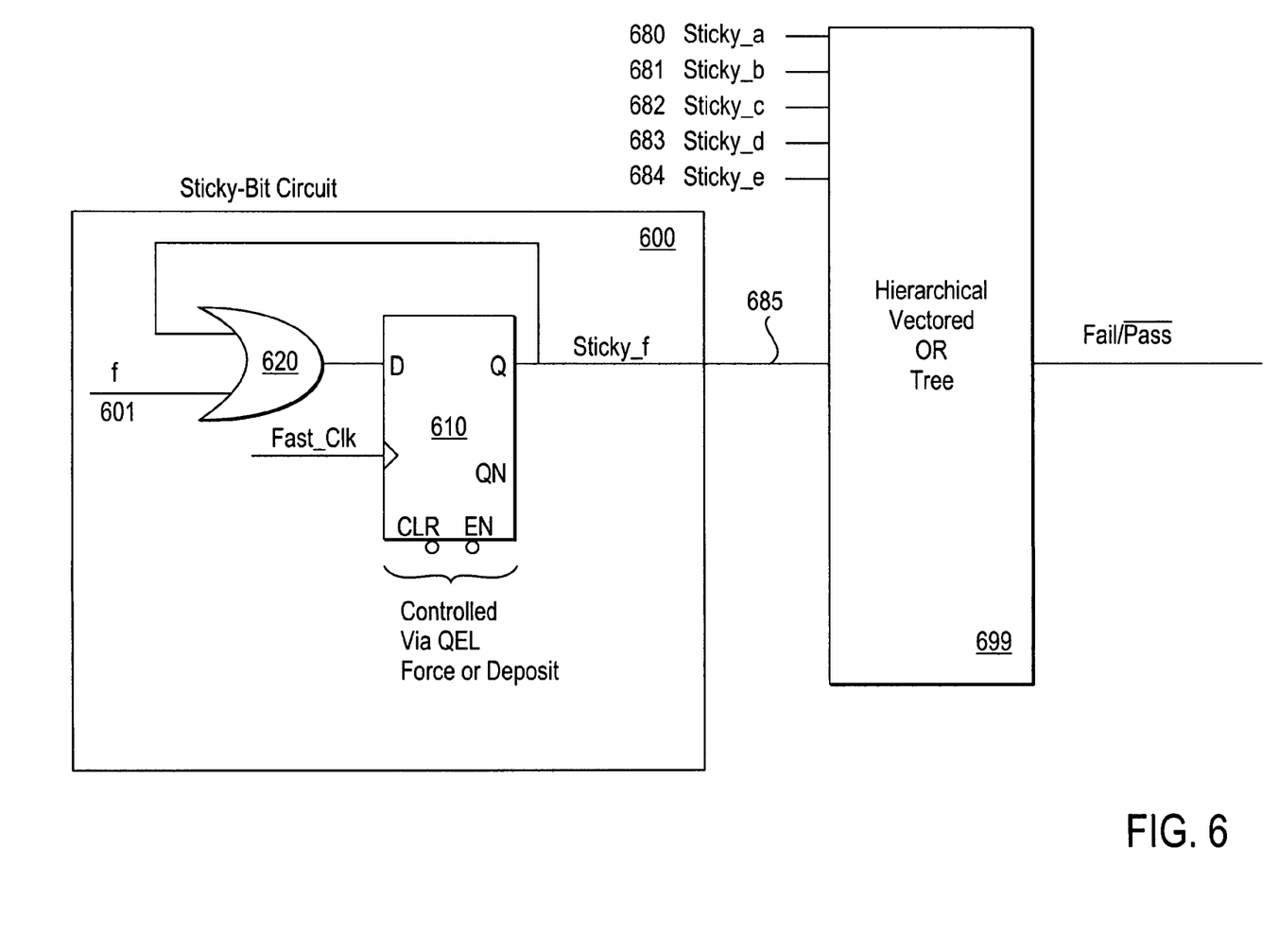
FIG. 6 illustrates a block diagram of an exemplary sticky-bit circuit, according to another embodiment of the present invention.

FIG. 6 illustrates a block diagram of an exemplary sticky-bit circuit 600, according to another embodiment of the present invention. Sticky bits 681-685 are added to the assertion instrumentation 699. There is one sticky bit associated with each firing assertion (f) 601 or selected category. When an assertion fires, the corresponding sticky bit in the sticky assertion vector will be set and remain set. This provides for a cumulative list of failed assertions at the end of the run. In an alternate embodiment, a counter could be provided for each assertion, or assertion category. Notice too that the pass/fail indicator falls out for free when assertion history via sticky-bits is included.

Figure 7:
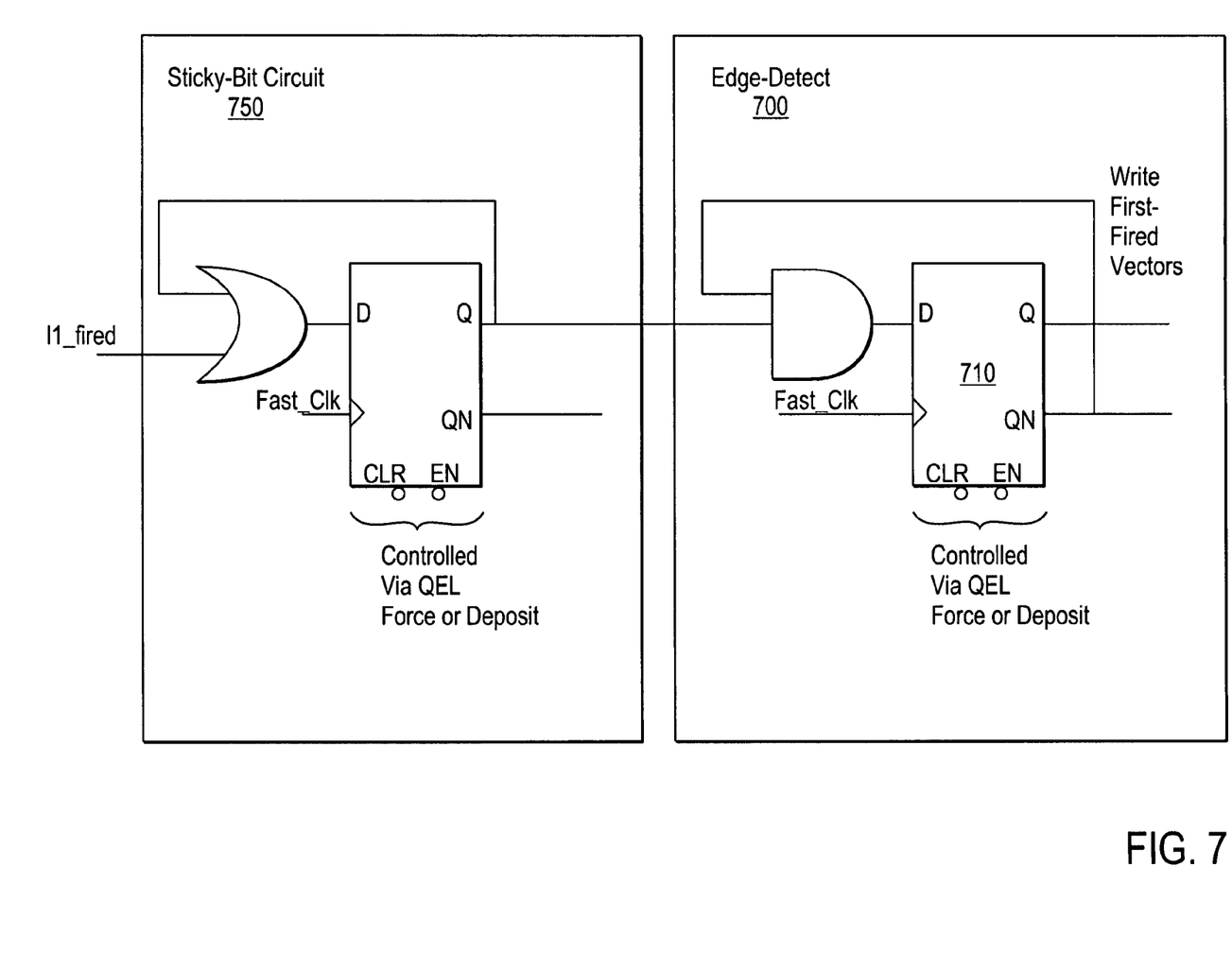
FIG. 7 illustrates a block diagram of an exemplary edge-detect circuit coupled to a sticky-bit circuit, according to an embodiment of the present invention.

FIG. 7 illustrates a block diagram of an exemplary edge-detect circuit 700 coupled to a sticky-bit circuit 750, according to an embodiment of the present invention. Edge-detect circuit 700 identifies the first assertion(s) that fires to provide a logical starting point for debug purposes. The first time an assertion fires, the first-fired register 710 is loaded to reflect the values of the assertion states at the time the first assertion firing was detected, thus identifying the first-fired. A level of hierarchy can be specified that affects the grouping of the first fired registers. All blocks at that level of hierarchy will have separate first-fired logic, so their first-fired vector represents the first to fire for the block at that level of hierarchy. This helps the hardware design engineer focus on the first assertion to fire and to identify other first-fire assertions that are more likely to be independent. Alternately, one could choose to capture the first "n" assertions of a specified category.

In an alternate embodiment not shown, a small memory can be added that contains ordering information for the first-fired assertions. The memory is wide enough to provide one status indication per first-fired circuit, and deep enough to allow all first-fired bits to change at different times. A vector is formed from the register in the first-to-fire detection circuit that indicates whether any assertions have fired in its circuit. The memory is loaded each time the vector changes. This provides ordering information to the hardware design engineer that helps in determining which assertions should be debugged first. An optional time stamp or relative ordering indicator could be associated with each as well.

In an alternate embodiment, to the vectored OR-tree based interrupt driven approach is to store assertion firing information into memory and post-process the memory content to generate a report. The information needed includes at least the assertion state bits and a time/cycle indicator. Several approaches could be used. For example, all assertion firings could be stored in memory until a specified fill level is reached, at which time the run stops or assertion recording just stops. One could reduce the amount of information by storing information on any change of the assertion reporting vector, or only when a new assertion becomes set, ignoring when it is cleared. This would capture when the assertion becomes set and when it is no longer set. This approach does not explain after how many design clocks was the assertion set. If the clock frequencies are known it can be calculated by the post processor. One could reduce the amount of information stored by limiting the number stored by category. Counters could be added in hardware to provide runtime controls that limit the number of assertion allowed by category. All assertions may be enabled or disabled The recording of assertions should may be enabled/disabled and the memory may be cleared at any time during the run. Waveform capture can be accomplished by rerunning. A report is generated at the end of the run that typically includes for each failing assertion, the assertion name, source file location and line number, severity, and the assertion code itself. The mapping file is used to map the bit in the first-fired or sticky-bit register with the report information.

The applications of this invention include emulation and simulation acceleration, both with static and dynamic targets, or no targets. Assertions of this type could also be used in FPGA based applications, especially sticky bits and first-fired. Simulation might also benefit from a hierarchical-based first-fired information, though this can already be determined by studying the log file.

The assertion instrumentation described above provides the current state of the assertion state signal with the hierarchy and severity-based vectored OR-tree that makes identifying the failed assertion efficient. It also provides the pass/fail indication, assertion state history, and the first-fired information. This assertion instrumentation can be used for all environments, though the assertion state OR-tree is not used in environments where the clock cannot be stopped. Storing history in the emulator 160 can reduce the number of stops/ starts required. Waveform capture may be automated on failure, or replay from an intermediate point can be done.

Figure 8:
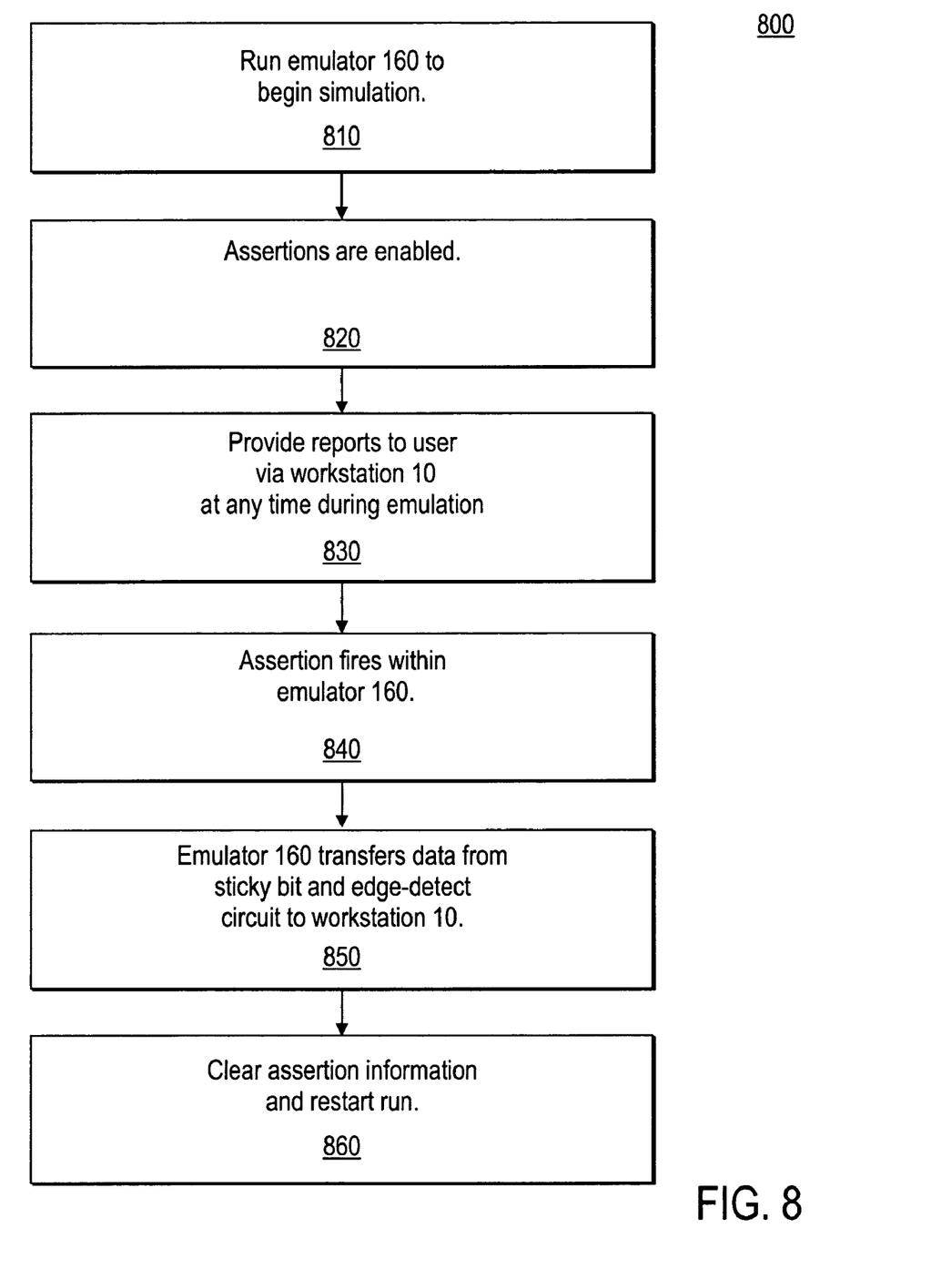
FIG. 8 illustrates a flow diagram for an exemplary flow diagram for historical assertion reporting at runtime, according to one embodiment of the present invention.

FIG. 8 illustrates a flow diagram for an exemplary flow diagram for historical assertion reporting at runtime, according to one embodiment of the present invention. For applications that do not tolerate stopping the clock, or when historical summary type of information is desired, runtime process flow 800 may be used. In this flow, the user runs the emulator 160 to get the system 100 to a desired initial state. (block 810) The assertions are enabled and the emulator 160 is run some more. (block 820) At any point in time, the user can request a report that provides a pass/fail indication, a history of which assertions have failed, and a listing of the first assertion to fire from each instance at a specified level of hierarchy. (block 830) At some point during the emulation run, an assertion may fire. (block 840) The circuits described in FIGS. 5-7 provide assertion information to workstation 10. (block 850) The assertion information can be cleared at any time to restart the run. (block 860) Any category of assertions can be disabled independently if desired.

A method and system for hardware based reporting of assertion information for emulation and hardware acceleration is disclosed. Although the present invention has been described with respect to specific examples and subsystems, it will be apparent to those of ordinary skill in the art that the invention is not limited to these specific examples or subsystems but extends to other embodiments as well. The present invention includes all of these other embodiments as specified in the claims that follow.

We claim:

1. A method of performing assertion-based verification, comprising:
    providing a user interface to design assertions that aid in verifying an integrated circuit design, wherein the user interface allows the assertions to be structured in a vectored OR-tree configuration;
    generating assertion instrumentation code to implement the assertions in hardware as assertion instrumentation; and
    providing the assertion instrumentation code to an emulator that generates the assertion instrumentation.

2. The method of claim 1, wherein the generating assertion instrumentation code comprises:
    determining if the emulator allows starting and stopping of emulations in response to firing assertions; and
    generating additional assertion instrumentation code to implement a sticky bit circuit and an edge detect circuit if the emulator does not allow the starting and stopping of emulations, wherein the sticky bit circuit and the edge detect circuit permit storing assertion history.

3. The method of claim 1, wherein the vectored OR-tree configuration is structured according to assertion severity, hierarchical blocks, assertion directives, assertion categories, and first-fired limits.

4. The method of claim 1, further comprising:
    receiving assertion information from the emulator when an assertion of the assertions fires during an emulation, the assertion information including debugging information, assertion waveform information, a name of a failing assertion, a line number and a filename of the instantiation of an instance, and a time of failure.

5. The method of claim 4, further comprising automatically generating assertion waveforms when the assertion of the assertions fires.

6. The method of claim 1, further comprising determining which assertion of the assertions fired by traversing the vectored OR-tree configuration.

7. A method of performing assertion-based verification, comprising:
    receiving assertion instrumentation code from a workstation, wherein the assertion instrumentation code includes a sticky bit circuit and an edge detect circuit, wherein the sticky bit circuit and the edge detect circuit permit storing assertion history; and
    implementing the assertion instrumentation code in hardware within an emulator.

8. The method of claim 7, further comprising:
    running an emulation based on the assertion instrumentation code;
    storing the assertion history when an assertion fails; and
    providing assertion failure information to the workstation.

9. A method of performing assertion-based verification, comprising:
    receiving assertion instrumentation code from a workstation, wherein the assertion instrumentation code implements a vectored OR-tree; and
    implementing the assertion instrumentation code in hardware within an emulator.

10. A method of performing assertion-based verification, comprising:
    receiving assertion instrumentation code from a workstation;
    implementing the assertion instrumentation code in hardware within the an emulator;
    running an emulation based on the assertion instrumentation code;
    stopping the emulation when an assertion fails; and
    providing assertion failure information to the workstation.

11. A system of performing assertion-based verification, comprising:
    means for providing a user interface to design assertions that aid in verifying an integrated circuit design, wherein the user interface allows the assertions to be structured in a vectored OR-tree configuration;
    means for generating assertion instrumentation code to implement the assertions in hardware as assertion instrumentation; and
    means for providing the assertion instrumentation code to an emulator that generates the assertion instrumentation.

12. The system of claim 11, wherein the means for generating assertion instrumentation code comprises:
    means for determining if the emulator allows starting and stopping of emulations in response to firing assertions; and
    means for generating additional assertion instrumentation code to implement a sticky bit circuit and an edge detect circuit if the emulator does not allow the starting and stopping of emulations, wherein the sticky bit circuit and the edge detect circuit permit storing assertion history.

13. The system of claim 11, wherein the vectored OR-tree configuration is structured according to assertion severity, hierarchical blocks, assertion directives, assertion categories, and first-fired limits.

14. The system of claim 11, further comprising:
means for receiving assertion information from the emulator when an assertion of the assertions fires during an emulation, the assertion information including debugging information, assertion waveform information, a name of a failing assertion, a line number and a filename of the instantiation of an instance, and a time of failure.

15. The system of claim 14, further comprising means for automatically generating assertion waveforms when the assertion of the assertions fires.

16. The system of claim 11, further comprising means for determining which assertion of the assertions fired by traversing the vectored OR-tree configuration.

17. A system of performing assertion-based verification, comprising:
means for receiving assertion instrumentation code from a workstation, wherein the assertion instrumentation code includes a sticky bit circuit and an edge detect circuit, wherein the sticky bit circuit and the edge detect circuit permit storing assertion history; and
means for implementing the assertion instrumentation code in hardware within an emulator.

18. The system of claim 17, further comprising:
means for running an emulation based on the assertion instrumentation code;
means for storing the assertion history when an assertion fails; and
means for providing assertion failure information to the workstation.

19. A system of performing assertion-based verification, comprising:
means for receiving assertion instrumentation code from a workstation, wherein the assertion instrumentation code implements a vectored OR-tree; and
means for implementing the assertion instrumentation code in hardware within an emulator.

20. A system of performing assertion-based verification, comprising:
means for receiving assertion instrumentation code from a workstation;
means for implementing the assertion instrumentation code in hardware within an emulator;
means for running an emulation based on the assertion instrumentation code;
means for stopping the emulation when an assertion fails; and
means for providing assertion failure information to the workstation.

21. A computer-readable medium having stored thereon a plurality of instructions, said plurality of instructions when executed by a computer, cause said computer to perform:
providing a user interface to design assertions that aid in verifying an integrated circuit design, wherein the user interface allows the assertions to be structured in a vectored OR-tree configuration;
generating assertion instrumentation code to implement the assertions in hardware as assertion instrumentation; and
providing the assertion instrumentation code to an emulator that generates the assertion instrumentation.

22. The computer-readable medium of claim 21, having stored thereon additional instructions, said additional instructions when executed by a computer to generate assertion instrumentation code, cause said computer to further perform:
determining if the emulator allows starting and stopping of emulations in response to firing assertions; and
generating additional assertion instrumentation code to implement a sticky bit circuit and an edge detect circuit if the emulator does not allow the starting and stopping of emulations, wherein the sticky bit circuit and the edge detect circuit permit storing assertion history.

23. The computer-readable medium of claim 21, wherein the vectored OR-tree configuration is structured according to assertion severity, hierarchical blocks, assertion directives, assertion categories, and first-fired limits.

24. The computer-readable medium of claim 21, having stored thereon additional instructions, said additional instructions when executed by a computer, cause said computer to further perform:
receiving assertion information from the emulator when an assertion of the assertions fires during an emulation, the assertion information including debugging information, assertion waveform information, a name of a failing assertion, a line number and a filename of the instantiation of an instance, and a time of failure.

25. The computer-readable medium of claim 24, having stored thereon additional instructions, said additional instructions when executed by a computer, cause said computer to further perform automatically generating assertion waveforms when the assertion of the assertions fires.

26. The computer-readable medium of claim 21, having stored thereon additional instructions, said additional instructions when executed by a computer, cause said computer to further perform determining which assertion of the assertions fired by traversing the vectored OR-tree configuration.

27. A computer-readable medium having stored thereon a plurality of instructions, said plurality of instructions when executed by a computer, cause said computer to perform:
receiving assertion instrumentation code from a workstation, wherein the assertion instrumentation code includes a sticky bit circuit and an edge detect circuit, wherein the sticky bit circuit and the edge detect circuit permit storing assertion history; and
implementing the assertion instrumentation code in hardware within an emulator.

28. The computer-readable medium of claim 27, further comprising:
running an emulation based on the assertion instrumentation code;
storing the assertion history when an assertion fails; and
providing assertion failure information to the workstation.

29. A computer-readable medium having stored thereon a plurality of instructions, said plurality of instructions when executed by a computer, cause said computer to perform:
receiving assertion instrumentation code from a workstation, wherein the assertion instrumentation code implements a vectored OR-tree; and
implementing the assertion instrumentation code in hardware within an emulator.

30. A computer-readable medium having stored thereon a plurality of instructions, said plurality of instructions when executed by a computer, cause said computer to perform:
receiving assertion instrumentation code from a workstation;
implementing the assertion instrumentation code in hardware within an emulator;
running an emulation based on the assertion instrumentation code;
stopping the emulation when an assertion fails; and
providing assertion failure information to the workstation.

31. An apparatus for performing assertion-based verification, comprising:
   a processor coupled to a bus;
   memory coupled to the bus that stores instructions; and
   an emulator interface,
   wherein the apparatus provides a user interface to design assertions that aid in verifying an integrated circuit design, wherein the user interface allows the assertions to be structured in a vectored OR-tree configuration;
   wherein the processor generates assertion instrumentation code to implement the assertions in hardware as assertion instrumentation; and
   wherein the emulator interface provides the assertion instrumentation code to an emulator that generates the assertion instrumentation.

32. The apparatus of claim 31, wherein the processor performing:
   determining if the emulator allows starting and stopping of emulations in response to firing assertions; and
   generating additional assertion instrumentation code to implement a sticky bit circuit and an edge detect circuit if the emulator does not allow the starting and stopping of emulations, wherein the sticky bit circuit and the edge detect circuit permit storing assertion history.

33. The apparatus of claim 31, wherein the vectored OR-tree configuration is structured according to assertion severity, hierarchical blocks, assertion directives, assertion categories, and first-fired limits.

34. The apparatus of claim 31, wherein the emulator interface receives assertion information from the emulator when an assertion of the assertions fires during an emulation, the assertion information including debugging information, assertion waveform information, a name of a failing assertion, a line number and a filename of the instantiation of an instance, and a time of failure.

35. The apparatus of claim 34, wherein the processor automatically generates assertion waveforms when the assertion of the assertions fires.

36. The apparatus of claim 31, wherein the processor determines which assertion of the assertions fired by traversing the vectored OR-tree configuration.

37. An emulator for performing assertion-based verification, comprising:
   a workstation interface that receives assertion instrumentation code from a workstation; and
   a processor that implements the assertion instrumentation code in hardware within the emulator, wherein the emulator includes a sticky bit circuit and an edge detect circuit, wherein the sticky bit circuit and the edge detect circuit permit storing assertion history.

38. The emulator of claim 37, wherein the emulator is performing:
   running an emulation based on the assertion instrumentation code;
   storing the assertion history when an assertion fails; and
   providing assertion failure information to the workstation via the workstation interface.

39. An emulator for performing assertion-based verification, comprising:
   a workstation interface that receives assertion instrumentation code from a workstation; and
   a processor that implements the assertion instrumentation code in hardware within the emulator, wherein the emulator implements a vectored OR-tree.

40. An emulator for performing assertion-based verification, comprising:
   a workstation interface that receives assertion instrumentation code from a workstation; and
   a processor that implements the assertion instrumentation code in hardware within the emulator, wherein the emulator runs an emulation based on the assertion instrumentation code; stops the emulation when an assertion fails; and provides assertion failure information to the workstation via the workstation interface.

* * * * *